United States Patent
Anderson et al.

(10) Patent No.: US 9,040,383 B2
(45) Date of Patent: May 26, 2015

(54) DEVICES WITH GATE-TO-GATE ISOLATION STRUCTURES AND METHODS OF MANUFACTURE

(71) Applicant: INTERNATIONAL BUSINESS MACHINES CORPORATION, Armonk, NY (US)

(72) Inventors: Brent A. Anderson, Jericho, VT (US); Edward J. Nowak, Essex Junction, VT (US); Jed H. Rankin, Richmond, VT (US)

(73) Assignee: International Business Machines Corporation, Armonk, NY (US)

( * ) Notice: Subject to any disclaimer, the term of this patent is extended or adjusted under 35 U.S.C. 154(b) by 118 days.

(21) Appl. No.: 13/772,993

(22) Filed: Feb. 21, 2013

(65) Prior Publication Data

US 2013/0164910 A1 Jun. 27, 2013

Related U.S. Application Data

(63) Continuation of application No. 12/902,803, filed on Oct. 12, 2010, now Pat. No. 8,455,330.

(51) Int. Cl.
| | |
|---|---|
| *H01L 21/76* | (2006.01) |
| *H01L 29/06* | (2006.01) |
| *H01L 21/02* | (2006.01) |

(Continued)

(52) U.S. Cl.
CPC ...... *H01L 29/0649* (2013.01); *H01L 21/02038* (2013.01); *H01L 21/76283* (2013.01); *H01L 21/845* (2013.01)

(58) Field of Classification Search
CPC ........... H01L 21/76283; H01L 21/845; H01L 21/02038; H01L 29/0649
USPC ................. 438/430, 587; 257/347, 401, 368, 257/E21.159, 288, E29.242
See application file for complete search history.

(56) References Cited

U.S. PATENT DOCUMENTS

| | | | |
|---|---|---|---|
| 6,022,781 A | 2/2000 | Noble, Jr. et al. | |
| 6,110,787 A | 8/2000 | Chan et al. | |

(Continued)

OTHER PUBLICATIONS

Notice of Allowance dated Jun. 27, 2014 for U.S. Appl. No. 13/589,606; 8 pages.

(Continued)

*Primary Examiner* — Shaun Campbell
(74) *Attorney, Agent, or Firm* — Michael J. LeStrange; Roberts Mlotkowski Safran & Cole, P.C.

(57) ABSTRACT

Devices having gate-to-gate isolation structures and methods of manufacture are provided. The method includes forming a plurality of isolation structures in pad films and an underlying substrate. The method further includes forming a plurality of fins including the isolation structures and a second plurality of fins including the two pad films and a portion of the underlying substrate, each of which are separated by a trench. The method further includes removing portions of the second plurality of fins resulting in a height lower than a height of the plurality of fins including the isolation structures. The method further includes forming gate electrodes within each trench, burying the second plurality of fins and abutting sides of the plurality of fins including the isolation structures. The plurality of fins including the isolation structures electrically and physically isolate adjacent gate electrode of the gate electrodes.

20 Claims, 11 Drawing Sheets

(51) Int. Cl.
  *H01L 21/762* (2006.01)
  *H01L 21/84* (2006.01)

(56) References Cited

U.S. PATENT DOCUMENTS

| | | | |
|---|---|---|---|
| 6,787,402 B1 | 9/2004 | Yu | |
| 6,924,178 B2 | 8/2005 | Beintner | |
| 7,453,123 B2 | 11/2008 | Dokumaci et al. | |
| 7,537,985 B2 | 5/2009 | Anderson et al. | |
| 7,557,401 B2 | 7/2009 | Yonehama et al. | |
| 7,666,732 B2 | 2/2010 | Doris et al. | |
| 8,455,330 B2 * | 6/2013 | Anderson et al. | 438/430 |
| 2005/0199919 A1 * | 9/2005 | Liu et al. | 257/288 |
| 2007/0026617 A1 | 2/2007 | Adkisson et al. | |
| 2007/0080409 A1 * | 4/2007 | Seliskar | 257/401 |
| 2008/0050866 A1 | 2/2008 | Booth et al. | |
| 2009/0045449 A1 * | 2/2009 | Aritome | 257/315 |
| 2009/0057778 A1 | 3/2009 | Dreeskornfeld et al. | |
| 2009/0309136 A1 | 12/2009 | Chen et al. | |
| 2010/0093167 A1 | 4/2010 | Lee et al. | |
| 2010/0118599 A1 | 5/2010 | Marshall et al. | |
| 2010/0248454 A1 | 9/2010 | Maszara et al. | |
| 2011/0241093 A1 * | 10/2011 | Wu | 257/302 |

OTHER PUBLICATIONS

Office Action dated Apr. 4, 2014 for U.S. Appl. No. 13/589,606; 11 pages.
Office Action dated Sep. 18, 2014 in U.S. Appl. No. 13/833,735; 8 pages.
Notice of Allowance dated Jan. 23, 2015 in U.S. Appl. No. 13/833,735; 7 pages.

* cited by examiner

US 9,040,383 B2

DEVICES WITH GATE-TO-GATE ISOLATION STRUCTURES AND METHODS OF MANUFACTURE

FIELD OF THE INVENTION

The invention relates to semiconductor structures and methods of manufacture and, more particularly, to devices having gate-to-gate isolation structures and methods of manufacture.

BACKGROUND

Photolithography (or "optical lithography") is a complex process used in semiconductor processing to selectively remove parts of a thin film or the bulk of a substrate to build structures. This process uses light to transfer a geometric pattern from a photo mask to a light-sensitive chemical, e.g., photoresist or "resist," on the substrate. A series of chemical treatments, e.g., etching processes, then engraves the exposure pattern into the material underneath the photoresist. In complex integrated circuits, for example a modern CMOS, a wafer may go through the photolithographic cycle up to 50 times. The patterning can be used to form gates, as well as isolation structures, wiring layers, contacts, etc.

As the imaging becomes ever so smaller in newer technologies, the photolithographic process must transfer smaller and smaller images (patterns) onto the photo mask. However, as conventional resolution limits of lithography continue to be exceeded, in particular at the 15 nm node, and beyond, new technology integration schemes may be needed to ease the burden on patterning. For example, in newer technologies it is becoming difficult to isolate transistors (gates) with critical spacing, while maintaining the minimum image of the gate electrodes, themselves. To ensure minimum image of the gate electrodes and that gates remain isolated (e.g., do not short circuit), large isolation regions are formed between gates. This can be accomplished with photolithographic process since such large isolation regions do not exceed conventional resolution limits of lithography. Although these large isolation regions allow the designer and engineer to maintain the minimum image of the gates, such isolation regions take up valuable chip real estate. This, in turn, limits the density of the chip.

Accordingly, there exists a need in the art to overcome the deficiencies and limitations described hereinabove.

SUMMARY

In a first aspect of the invention, a method comprises forming a plurality of isolation structures in pad films and an underlying substrate. The method further comprises forming a plurality of fins comprising the isolation structures and a second plurality of fins comprising the two pad films and a portion of the underlying substrate, each of which are separated by a trench. The method further comprises removing portions of the second plurality of fins resulting in a height lower than a height of the plurality of fins comprising the isolation structures. The method further comprises forming gate electrodes within each trench, burying the second plurality of fins and abutting sides of the plurality of fins comprising the isolation structures. The plurality of fins comprising the isolation structures electrically and physically isolate adjacent gate electrode of the gate electrodes.

In another aspect of the invention, a method comprises forming a plurality of pad films each having different material compositions on a substrate. The method further comprises etching the pad films and a portion of the substrate to form a plurality of trenches. The method further comprises filling the trenches with insulator material to form a plurality of isolation structures. The method further comprises forming a second plurality of trenches which result in formation of a plurality of fins comprising the isolation structures and a plurality of composite fins comprising the plurality of pad films and the portion of the substrate. The method further comprises removing an upper portion of the plurality of composite fins resulting in a height different than the plurality of fins comprising the isolation structures. The method further comprises forming electrode stacks within each of the second plurality of trenches, burying the plurality of composite fins and abutting sides of the plurality of fins comprising the isolation structures. The plurality of fins comprising the isolation structures electrically and physically isolate adjacent electrode stacks.

In yet another aspect of the invention, a structure comprises a first set of fins comprising substrate and insulator stacks. The structure further comprises a second set of fins comprising insulator-only stacks. The structure further comprises a plurality of gate stack regions burying the first set of fins and being electrically and physically isolated by the second set of fins.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the gate to gate isolation structure, which comprises the structures of the present invention. In still further embodiments, a method in a computer-aided design system is provided for generating a functional design model of the gate to gate isolation structure. The method comprises generating a functional representation of the structural elements of the gate to gate isolation structure.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and methods of manufacture and, more particularly, to devices having gate-to-gate isolation structures and methods of manufacture. More specifically, the present invention includes selectively raised isolation regions at desired gate isolation points to provide isolation structures between adjacent gates (transistors), and methods of manufacture. Advantageously, the structures and methods of the present invention allow for increased device density on the chip, while maintaining minimal image spacing (uniformity) for the technology node. The present invention also advantageously allows the manufacture of gates that are uniform, with uniform pitch, and with repeating patterns. The present invention also allows for flexible circuit design, and can be used for finFETs as well as other devices. Thus, in embodiments, the present invention isolate gates form adjacent FETs without disruption of the regular gate patterns and without large density penalties.

Figure 1:
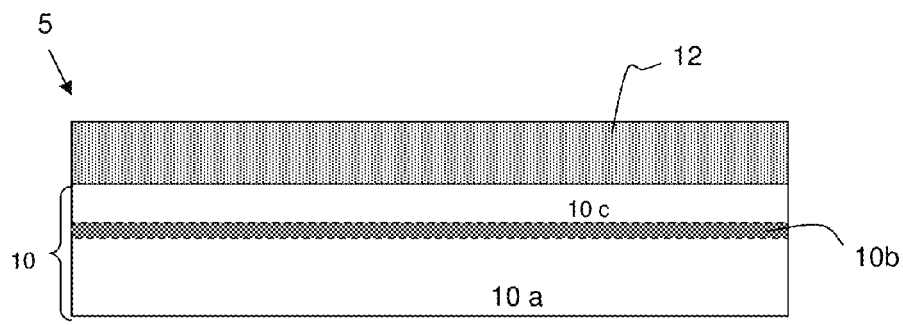
FIGS. 1-7 show structures and respective processing steps in accordance with an aspect of the present invention.

FIGS. 1-7 show structures and respective processing steps in accordance with an aspect of the present invention. More specifically, FIG. 1 is a starting structure 5 comprising a semiconductor wafer (substrate) 10. The wafer 10 can be a BULK Si wafer or a silicon on insulator (SOI) wafer. The SOI wafer can include a buried oxide 10b sandwiched between a lower Si layer 10a and upper silicon layer 10c. Although FIGS. 1-7 show an SOI wafer, it should be understood by those of skill in the art that the structure of the present invention can be equally manufactured with BULK technology.

A pad film 12 is formed on the wafer 10 using, for example, conventional deposition processes such as, for example, chemical vapor deposition (CVD), plasma enhanced CVD (PECVD) or other conventional deposition processes. In embodiments, the pad film 12 can be a stack such as, for example, $SiO_2$ and $Si_3N_4$ or other known pad film materials. In embodiments, the pad film 12 can be about 50 nm to 600 nm in thickness, depending on the design criteria of the device. In embodiments using a stack, the $SiO_2$ can be about 10 nm to about 50 nm and the $Si_3N_4$ can be about 50 nm to about 500 nm.

Figure 2:
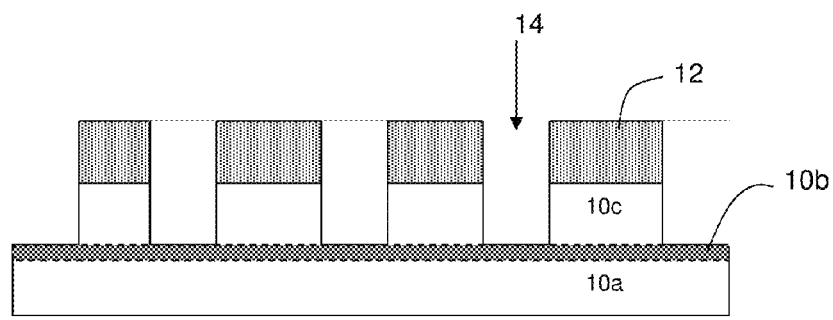

In FIG. 2, trenches 14 are formed in the pad film 12 and portions of the wafer 10. In embodiments using an SOI wafer, the trenches 14 would extend to the oxide layer 10b. The width of the trenches 14 can be about 20 nm and the spacing between the trenches 14 can be about 20 nm or more. In embodiments, the trenches 14 and spacing therebetween are uniform and provide a regular pattern; although other configurations are also contemplated by the present invention. It should be understood by those of skill in the art that as technology nodes advance, the width of the trenches and the spacing therebetween can correspond to the available minimum image spacing.

In embodiments, the trenches 14 can be formed using conventional lithographic processes. For example, a resist can be formed on the pad film 12 and exposed to light to form openings. A reactive ion etching (RIE) is then performed to form the trenches 14. The resist can then be stripped using conventional dry etching techniques, for example.

Figure 3:
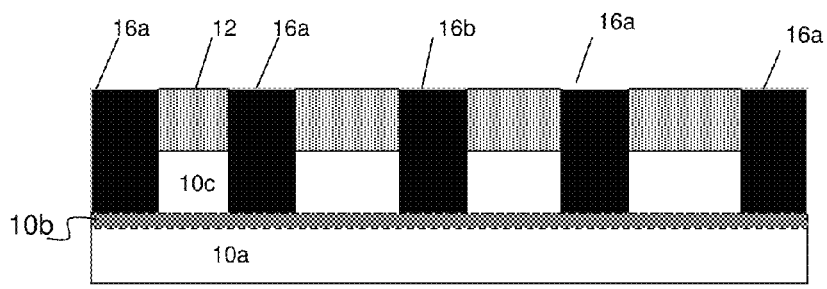

As shown in FIG. 3, the trenches are filled with an insulator material to form isolation structures 16a and 16b. In embodiments, the insulator material is $SiO_2$; although, other insulator materials are also contemplated by the present invention such as, for example, oxide. In embodiments, the insulator material is deposited within the trenches using conventional deposition processes. After the deposition of the insulator material, the structure of FIG. 3 can undergo planarization processes such as, for example, chemical mechanical polishing (CMP).

Figure 4:
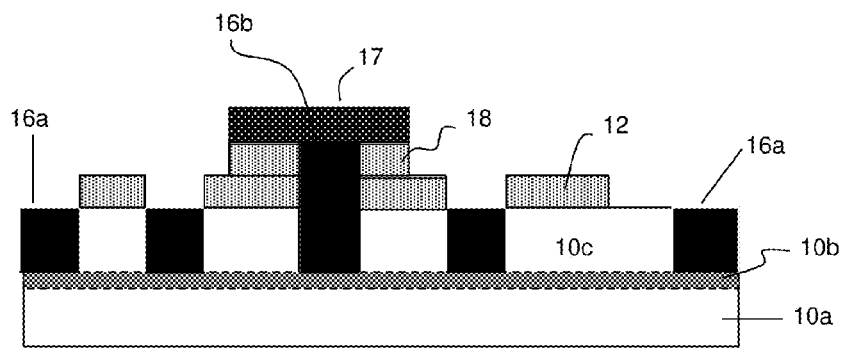

FIG. 4 shows additional processing steps in accordance with aspects of the present invention. More specifically, in embodiments, a mask 17 is formed over the isolation structure 16b, in order to protect the isolation structure 16b from subsequent etching processes. This will ensure that the isolation structure 16b remains at a sufficient height to isolate adjacent gate structures. Advantageously, the isolation structure 16b is at a minimum image spacing, which increases the overall density of the chip, i.e., allows adjacent gates to be isolated, yet separated by a minimal distance.

Once the mask 17 is formed, the unprotected regions, e.g., unprotected portions of the pad film 12 and isolation structures 16a, undergo etching processes, which form a stepped region 18 (higher region) adjacent to the isolation structure 16b (and remaining portion of the structure). In this manner, the isolation structures 16a and 16b are at a dual height.

In embodiments, the etching process can remove portions of the pad film 12 and isolation structures 16a, with later etching processes removing the remaining portions of the pad film 12. In further embodiments, the etching process can remove all of the unprotected portions of the pad film 12 (see, e.g., FIG. 5) and portions of the isolation structures 16a, with later processes removing the remaining portions of the pad film 12 adjacent to the isolation structure 16b. In still further embodiments, a first etching process would only remove portions of the isolation structures 16a, depending on the etch chemistry, with subsequent etching processing removing the pad film 12. In any of these different processing scenarios, the resultant isolation structures 16a and 16b are provided at a dual height, since isolation structures 16a are partially etched to a lower height than the isolation structures 16b.

Figure 5:
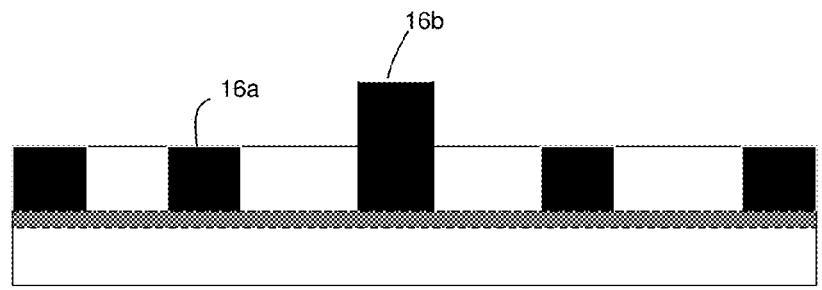

In FIG. 5, the mask 17 and pad film 12 are completely removed, leaving dual height isolation structures 16a and 16b and exposed portions of the wafer 10. In embodiments, the pad film 12 is selectively removed, without removing any material from the isolation structures 16a and 16b. This selective removal process can be accomplished using a selective etch chemistry known to those of skill in the art, which depends on the material used for the isolation structures 16a and 16b and pad film 12. As a result of the etching processes, the isolation structure 16b will be higher (taller) than the surrounding isolation structures 16a. In this way, the structure can comprise a regular array of active semiconductor islands separated by isolation regions, wherein the isolation structures (e.g., isolation regions) comprise a first height isolation region 16a and a second height isolation region 16b.

Figure 6:
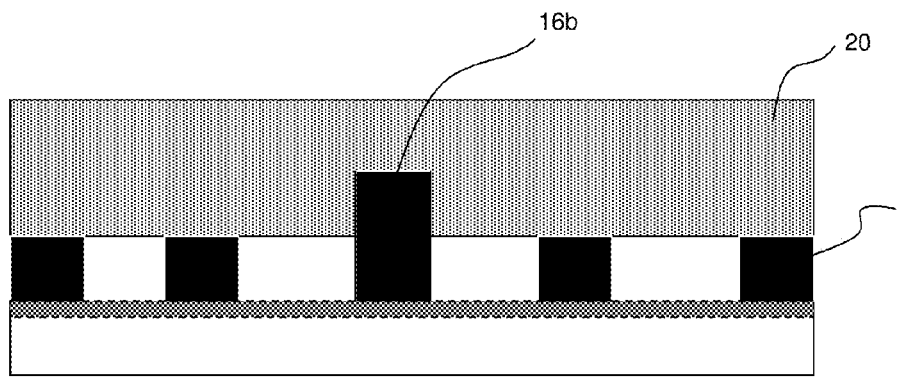

In FIG. 6, a gate stack 20 is formed over the isolation structures 16a and 16b and the exposed portions of the wafer 10. The gate stack 20 can be, for example, a gate dielectric and a gate electrode material, conformally deposited on the isolation structures 16a and 16b and the exposed portions of the wafer 10. In embodiments, the gate dielectric can be, for example, $SiO_2$, with the gate electrode material being polysilicon. In further embodiments, the gate dielectric can be, for example, a high-k dielectric material such as silicon oxynitride, with the gate electrode material being either a metal or a metal and polysilicon stack. Those of skill in the art should understand that other gate dielectric materials are also contemplated by the present invention, depending on the required performance of the device. Sidewall spacers and capping layers can also be formed using conventional deposition processes.

Figure 7:
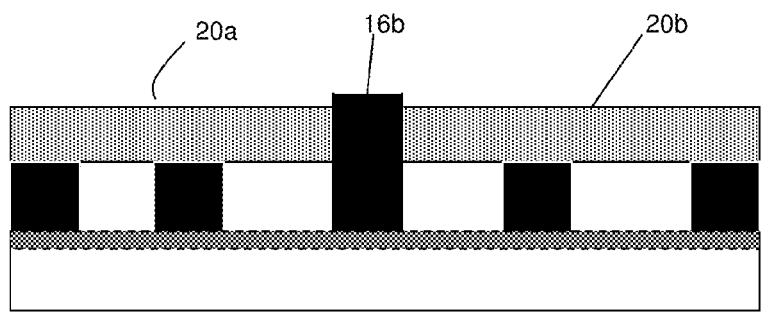

In FIG. 7, the gate electrode 20 is partially etched away to expose the isolation structure 16b. In embodiments, the gate electrode will cover or bury the isolation structures 20a. In this way, gates 20a, 20b, are formed on the wafer 20, separated by the isolation structure 16b. In embodiments, the gates 20a, 20b will abut against the sides of the isolation structure 16b, which will provide a physical and electrical separation between the gates 20a, 20b. It should be understood by those of skill in the art that more than two gates can be formed on the wafer 20 using the processes described herein. Source and drain regions can be formed on the sides of the gates 20a, 20b (in active regions) using conventional doping/implantation processes.

Figure 8:
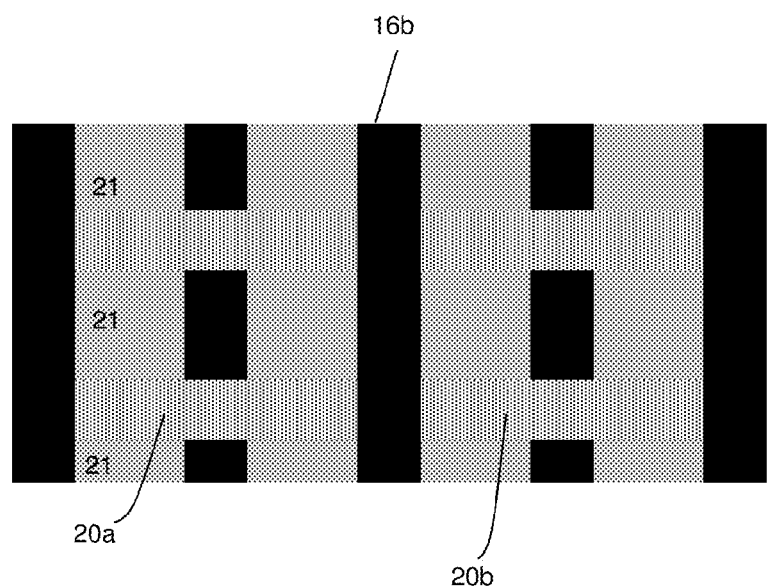
FIG. 8 is a top view of the structure shown in FIG. 7, in accordance with an aspect of the present invention.

FIG. 8 is a top view of the structure of FIG. 7. As shown in FIG. 8, the isolation structure 16b provides a physical and electrical separation between the gates 20a, 20b. In further embodiments, the gates 20a, 20b can extend onto the isolation structures 16a to form contacts. Also, to complete the device fabrication process, source/drain regions 21 can be formed on respective sides of the gate and between each of the isolation structures (in active regions) using conventional doping and/or implantation processes. In further embodiments, contacts can be connected to the source/drain and gate electrodes using conventional etching and metal deposition processes, with upper wire layers also contemplated by the present invention.

Figure 9:
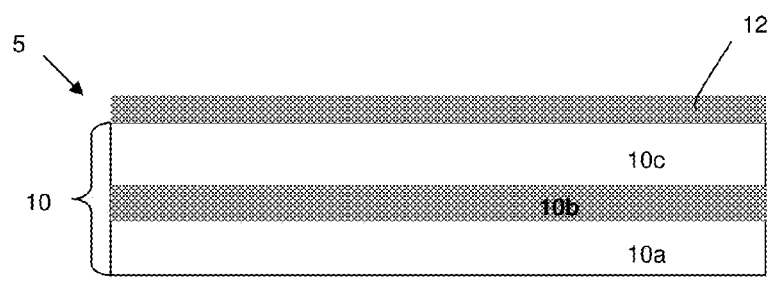
FIGS. 9-14 show structures and respective processing steps in accordance with an aspect of the present invention.

FIGS. 9-14 show structures and respective processing steps in accordance with an aspect of the present invention. More specifically, FIG. 9 is a starting structure 5 comprising a semiconductor wafer (substrate) 10. The wafer 10 can be a BULK Si wafer or a silicon on insulator (SOI) wafer. The SOI wafer can include a buried oxide 10b sandwiched between a lower Si layer 10a and upper silicon layer 10c. Although FIGS. 9-14 show an SOI wafer, it should be understood by those of skill in the art that the structure of the present invention can be equally manufactured with BULK technology.

A pad film 12 is formed on the wafer 10 using, for example, conventional deposition processes such as, for example, chemical vapor deposition (CVD), plasma enhanced CVD (PECVD) or other conventional deposition processes. In embodiments, the pad film 12 can be a stack such as, for example, $SiO_2$ and $Si_3N_4$ or other known pad film materials, as describe above in detail.

Figure 10:
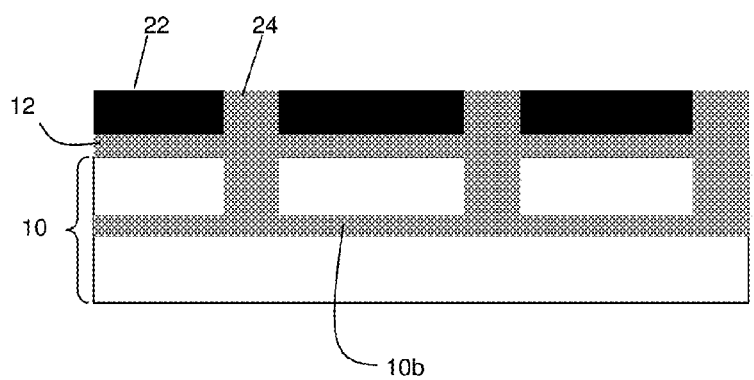

In FIG. 10, a pad film 22 is formed on the pad film 12 using conventional processes such as, for example, CVD, PECVD, etc. In embodiments, the pad film 22 is $Si_3N_4$ so that subsequent etching processes can be performed, as described herein. Trenches are formed in the pad films 12, 22 and portions of the wafer 10 using conventional lithographic processes, as already described. In embodiments using an SOI wafer, the trenches would extend to the oxide layer 10b. The width of the trenches can be about 20 nm and the spacing between the trenches can be about 20 nm or more. It should be understood by those of skill in the art that as technology nodes advance, the width of the trenches and the spacing therebetween can correspond to the available minimum image spacing. In embodiments, the trenches and spacing therebetween are uniform and provide a regular pattern; although other configurations are also contemplated by the present invention.

As further shown in FIG. 10, the trenches are filled with an insulator material to form isolation structures 24. In embodiments, the insulator material is $SiO_2$; although, other insulator materials are also contemplated by the present invention such as, for example, oxide. In embodiments, the insulator material is deposited within the trenches using conventional deposition processes. After the deposition of the insulator material, the structure of FIG. 3 can undergo planarization processes such as, for example, mechanical chemical polishing (CMP).

Figure 11:
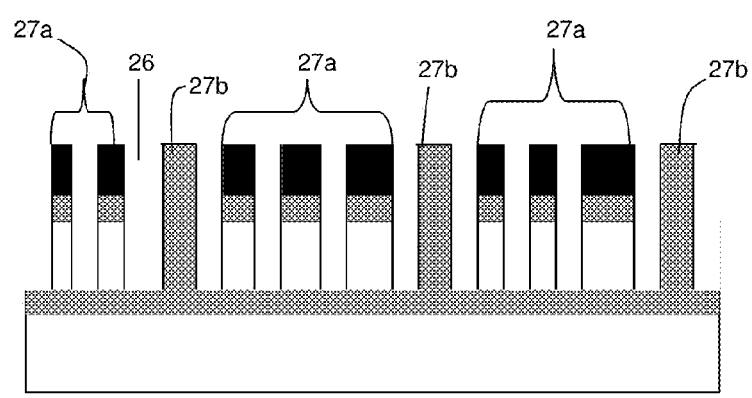

FIG. 11 shows additional trench formation processing in accordance with aspects of the present invention. More specifically, in embodiments, a mask is formed over the structure of FIG. 10 and exposed to light to form a pattern (openings). In embodiments, the openings are formed in uniform and regular patterns, with the mask protecting the isolation structures 24 (or portions thereof) from subsequent etching processes. A RIE process is then performed to form trenches 26 and fins 27a and 27b (also isolation structures). In embodiments, the width of the trenches 26 is about 50 nm, and the spacing between the trenches 26 (e.g., fins 27a, 27b) is about 10 nm. The resist can be stripped in a conventional stripping process. In embodiments, the trenches 27a are formed from a composite of materials including the pad films 12, 22 and a portion of the wafer 10. The trenches 27b, on the other hand, are composed of the insulator material of the isolation structures.

Figure 12:
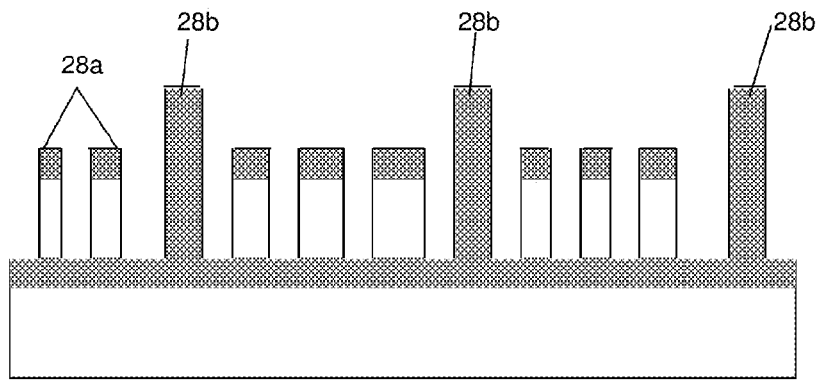

In FIG. 12, the remaining portion of the pad film 22 is removed from the fins 27a, leaving isolation structures 28a and 28b. This results in dual height isolation structures 28a and 28b. As shown, the isolation structure 28b is taller than the surrounding isolation structures 28a. In embodiments, the etching processes is selective to the pad film, e.g., $Si_3N_4$. In this way, the structure comprises a regular array of active semiconductor islands separated by isolation regions, wherein the isolation structures (e.g., isolation regions) comprise a first height isolation region 28a and a second height isolation region 28b.

Figure 13:
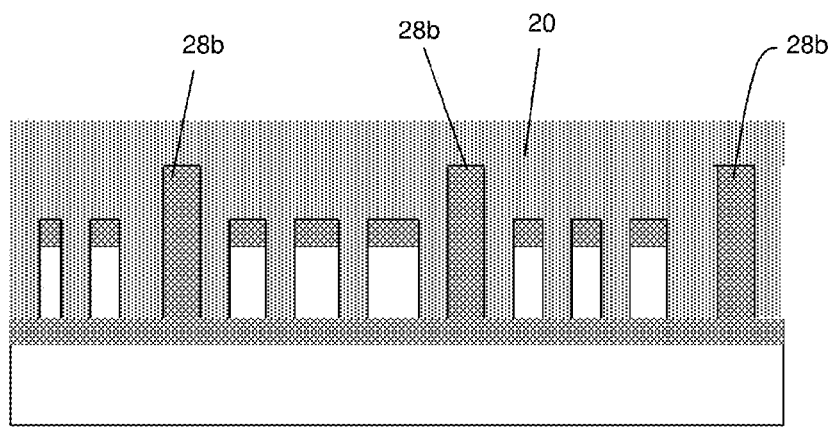

In FIG. 13, gate stack 20 is formed over the isolation structures 28a and 28b and the exposed portions of the wafer 10. The gate stack 20 can be, for example, a gate dielectric and a gate electrode material, conformally deposited on the isolation structures 28a and 28b and the exposed portions of the wafer 10. In embodiments, the gate dielectric can be, for example, $SiO_2$, with the gate electrode material being polysilicon. In further embodiments, the gate dielectric can be, for example, a high-k dielectric material such as silicon oxy nitride, with the gate electrode material being either a metal or a metal and polysilicon stack. Those of skill in the art should understand that other gate dielectric materials are also contemplated by the present invention, depending on the required performance of the device.

Figure 14:
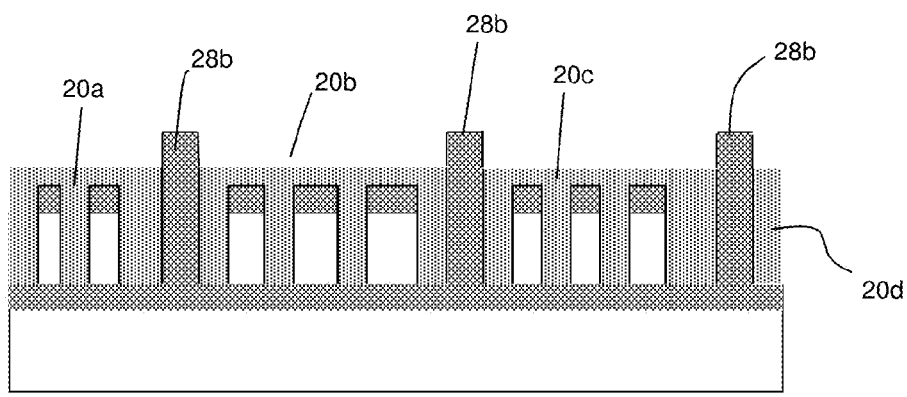

In FIG. 14, the gate electrode 20 is partially etched away to expose the isolation structure 28b. In embodiments, the gate electrode will cover or bury the isolation structures 28a. In this way, gates 20a-20d are formed on the wafer 20, separated by the isolation structures 28b. In embodiments, the gates abut against the sides of the isolation structure 28b, which will provide a physical and electrical separation between the gates 20a-20d. Advantageously, the isolation structures 28b are at a minimum image spacing, which increases the overall density of the chip, i.e., allows adjacent gates to be isolated, yet separated by a minimal distance. It should be understood by those of skill in the art that any number of gates can be formed on the wafer 20 using the processes described herein. Source and drain regions can then be formed on the sides of the gates 20a-20d (in active regions) using conventional doping/implantation processes.

Figure 15:
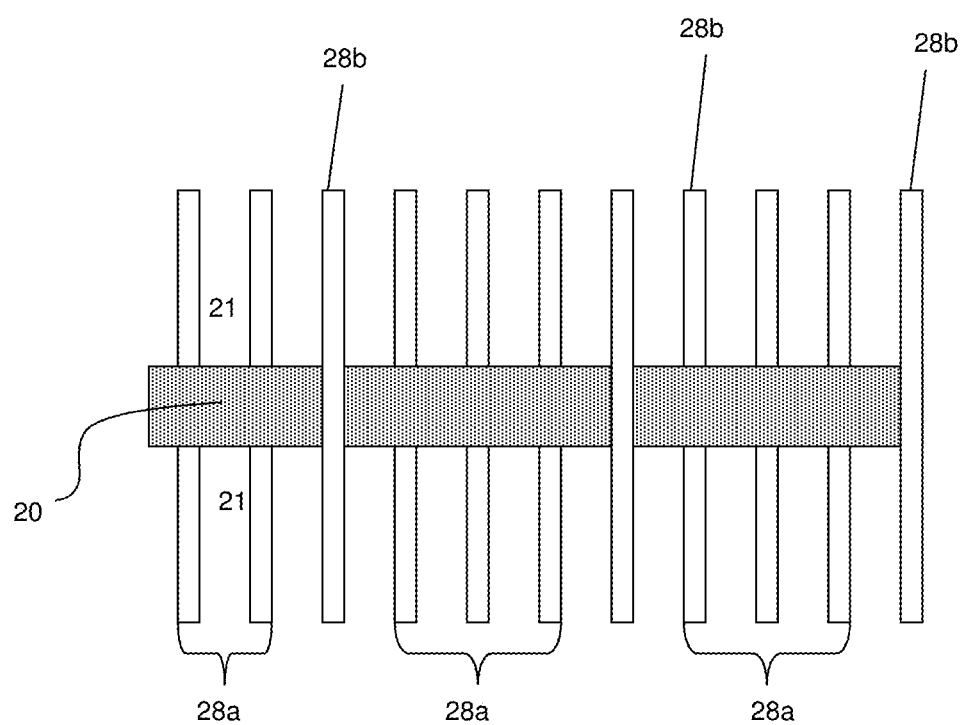
FIG. 15 is a partial top view of the structure shown in FIG. 14, in accordance with an aspect of the present invention.

FIG. 15 is a partial top view of the structure of FIG. 14. As shown in FIG. 15, the isolation structures 28b provide a physical and electrical separation between the gates. In further embodiments, the gates can extend onto the isolation structures 28a to form contacts. Also, to complete the device fabrication process, source/drain regions 21 can be formed on respective sides of the gate and between each of the isolation structures (in active regions) using conventional doping and/or implantation processes. In further embodiments, contacts can be connected to the source/drain and gate electrodes using conventional etching and metal deposition processes, with upper wire layers also contemplated by the present invention.

Figure 16:
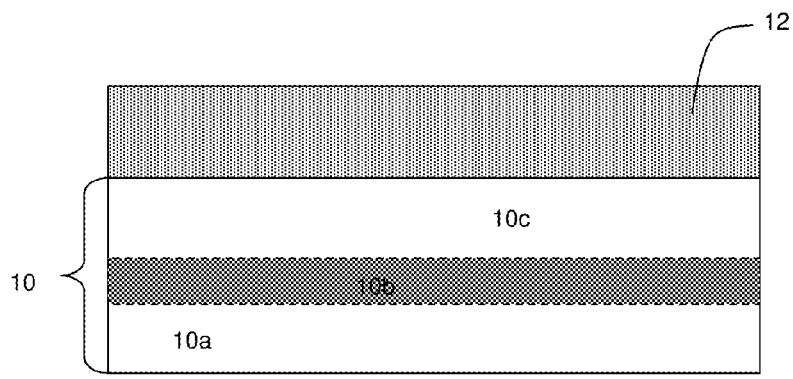
FIGS. 16-23 show structures and respective processing steps in accordance with an aspect of the present invention.

FIGS. 16-23 show structures and respective processing steps in accordance with an aspect of the present invention. More specifically, FIG. 16 is a starting structure 5 comprising a semiconductor wafer (substrate) 10. The wafer 10 can be a BULK Si wafer or a silicon on insulator (SOI) wafer. The SOI wafer can include a buried oxide 10b sandwiched between a lower Si layer 10a and upper silicon layer 10c. Although FIGS. 16-23 show an SOI wafer, it should be understood by those of skill in the art that the structure of the present invention can be equally manufactured with BULK technology.

A pad film 12 is formed on the wafer 10 using, for example, conventional deposition processes such as, for example, chemical vapor deposition (CVD), plasma enhanced CVD (PECVD) or other conventional deposition processes. In embodiments, the pad film 12 can be a stack such as, for example, $SiO_2$ and $Si_3N_4$ or other known pad film materials, as describe above in detail.

Figure 17:
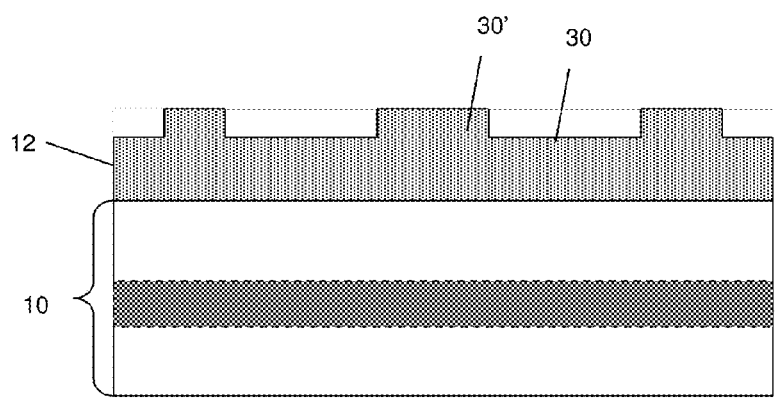
Figure 18:
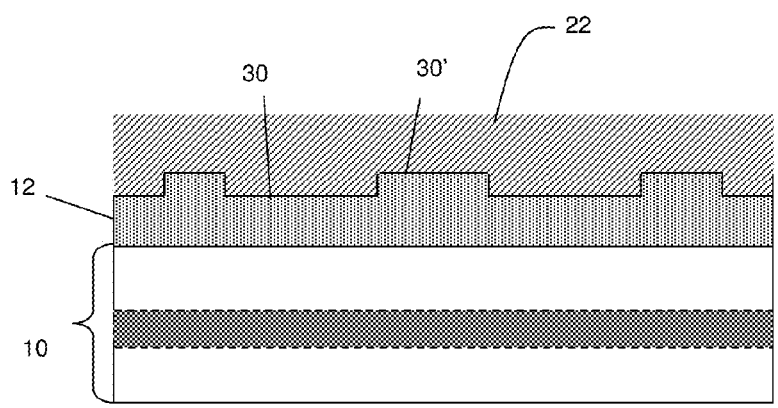

In FIG. 17, shallow trenches 30 are formed in the pad layer 12 using conventional etching processes. The shallow trenches form raised portions 30'. In embodiments, the trenches 30 do not extend into the wafer 10. In FIG. 18, a pad film (e.g., hard mask) 22 is formed in the trenches 30 and on the raised portions 30' of the pad film 12 using conventional processes such as, for example, CVD, PECVD, etc. In embodiments, the pad film 22 is $Si_3N_4$. In embodiments, the pad film 22 extends outside of the trenches.

Figure 19:
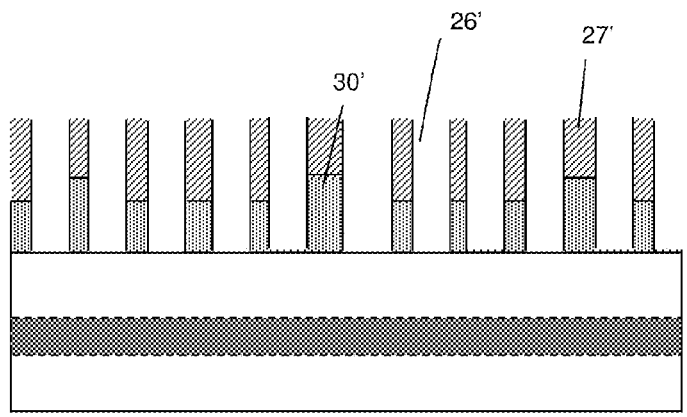

In FIG. 19, trenches 26' are formed in the pad films 12, 22. More specifically, in embodiments, a mask is formed over the structure of FIG. 18 and exposed to light to form a pattern (openings). In embodiments, the openings are formed in uniform and regular patterns. A RIE process is then performed to form trenches 26' and fins 27'. In embodiments, the width of the trenches 26' is about 50 nm, and the spacing between the trenches 27' (e.g., fins 27') is about 10 nm. A plurality of fins 27' can be composed of the raised portion 30'.

Figure 20:
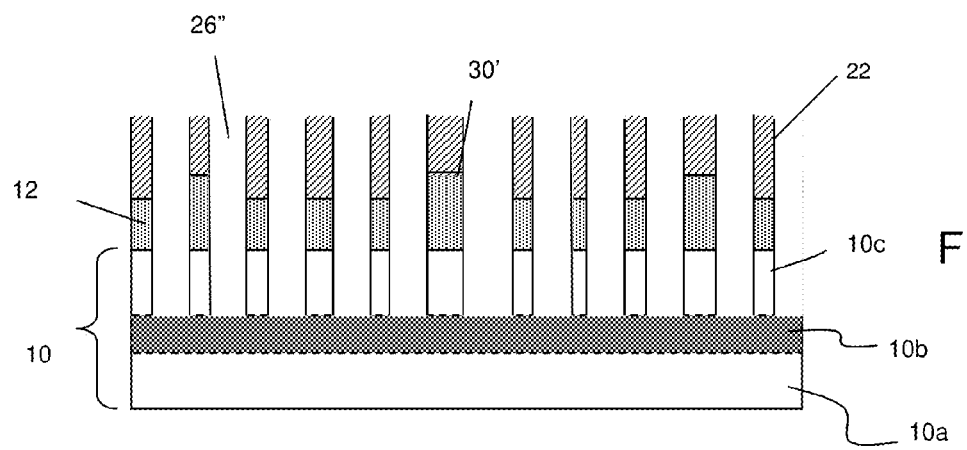

In FIG. 20, the upper film of the wafer 10, e.g., layer 10c, is etched to further increase the depth of the trenches 26" (e.g., forming a deep trench) to the oxide layer 10b. In BULK technology, the depth of the trenches 26" can vary within the wafer 10. After the trenches 26" are fully formed, the resist can be stripped in a conventional stripping process.

Figure 21:
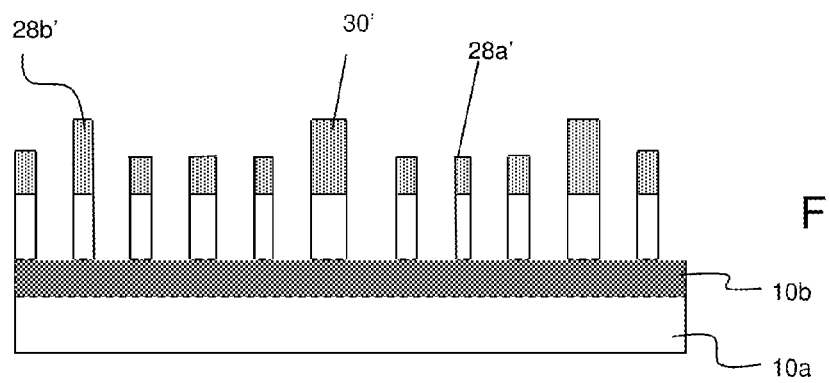

In FIG. 21, the remaining portion of the pad film 22 is removed from the fins, leaving isolation structures 28a' and 28b'. This results in dual height isolation structures 28a' and 28b'. As shown, the isolation structure 28b' is taller than the surrounding isolation structures 28a', as it is composed of the raised portion 30'.

Figure 22:
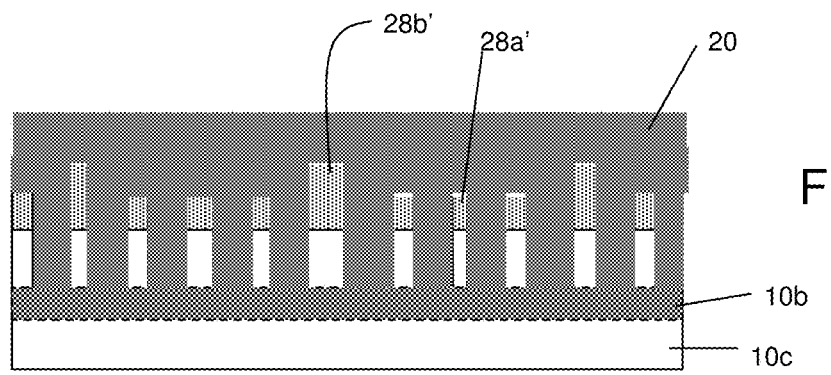

In FIG. 22, gate stack 20 is formed over the isolation structures 28a' and 28b' and the exposed portions of the wafer 10. The gate stack 20 can be, for example, a gate dielectric and a gate electrode material, conformally deposited on the isolation structures 28a' and 28b' and the exposed portions of the wafer 10. In embodiments, the gate dielectric can be, for example, $SiO_2$, with the gate electrode material being polysilicon. In further embodiments, the gate dielectric can be, for example, a high-k dielectric material such as silicon oxy nitride, with the gate electrode material being either a metal or a metal and polysilicon stack. Those of skill in the art should understand that other gate dielectric materials are also contemplated by the present invention, depending on the required performance of the device.

Figure 23:
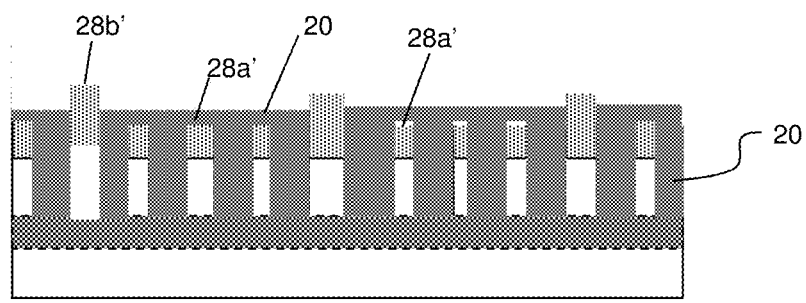

In FIG. 23, the gate stack 20 is partially etched away to expose the isolation structure 28b'. In embodiments, the gate stack will cover or bury the isolation structures 28b'. In this way, gates 20a-20b are formed on the wafer 20, separated by the isolation structures 28b'. In embodiments, the gates abut against the sides of the isolation structure 28b', which will provide a physical and electrical separation between the gates 20a-20b. In this way, the structure comprises a regular array of active semiconductor islands separated by isolation regions, wherein the isolation structures (e.g., isolation regions) comprise a first height isolation region 28a' and a second height isolation region 28b'. Also, advantageously, the isolation structures 28b' are at a minimum image spacing, which increases the overall density of the chip, i.e., allows adjacent gates to be isolated, yet separated by a minimal distance. In each aspect of the present invention, the minimum image width (critical image dimension) of the isolation structures is not merely a design criteria, but is only possible with the processes of the present invention.

Source and drain regions can then be formed on the sides of the gates 20a-20b (in active regions) using conventional doping/implantation processes. It should be understood by those of skill in the art that any number of gates can be formed on the wafer 20 using the processes described herein.

Figure 24:
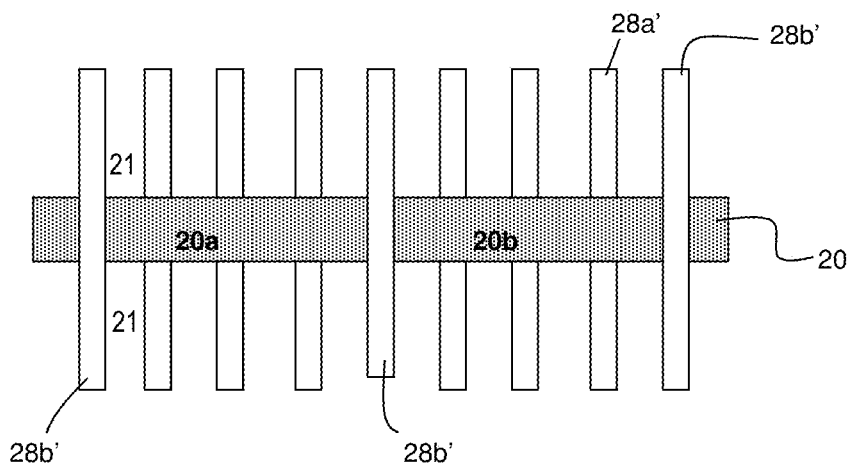
FIG. 24 is a partial top view of the structure shown in FIG. 23, in accordance with an aspect of the present invention.

FIG. 24 is a partial top view of the structure of FIG. 23. As shown in FIG. 24, the isolation structure 28b' provides a physical and electrical separation between the gates. In further embodiments, the gates can extend onto the isolation structures 28a' to form contacts. Also, to complete the device fabrication process, source/drain regions 21 can be formed on respective sides of the gate and between each of the isolation structures (in active regions) using conventional doping and/or implantation processes. In further embodiments, contacts can be connected to the source/drain and gate electrodes using conventional etching and metal deposition processes, with upper wire layers also contemplated by the present invention.

Figure 25:
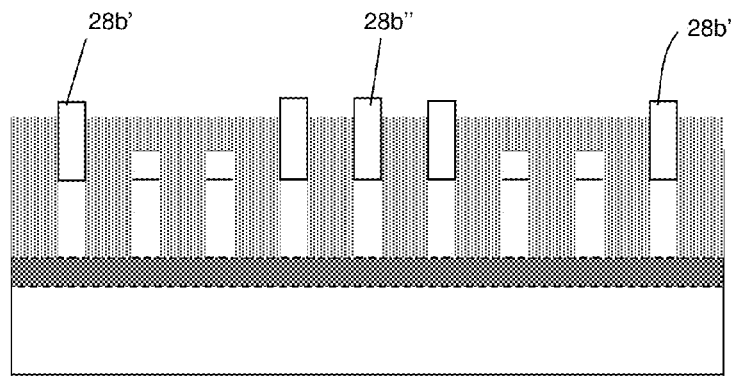
FIG. 25 is a cross sectional of another perspective view of the structure of FIG. 23, in accordance with an aspect of the present invention.
Figure 26:
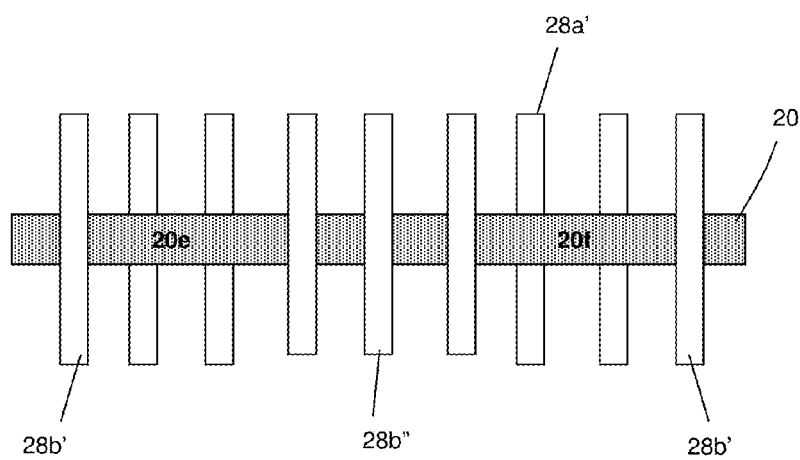
FIG. 26 is a partial top view of the structure shown in FIG. 25, in accordance with an aspect of the present invention.

In FIG. 25 shows a cross sectional view of another perspective of the structure manufactured in accordance with aspects of the present invention. FIG. 26 shows a partial top view of the structure of FIG. 25. As shown in these views, a split gate finFET can be formed using the processes of the present invention. In this structure, the split gate finFET includes two electrically isolated gates 20e, 20f. The electrically isolated gates 20e, 20f are isolated from one another by isolation structure 28b". The electrically isolated gates 20e, 20f are also isolated from other gates by the isolation structures 28b'. In embodiments, isolation structures are not formed underneath the gates 20e, 20f, which can each have a separate voltage applied thereto. In this manner, the present invention provides a split gate finFET and fin isolated double gate finFET where the split gate finFET comprises a tall fin structure and the double gate finFET comprises a short fin structure, and a gate electrode structure of a height greater than the short fin structure and less than the tall fin structure. It should be understood by those of skill in the art that any number of gates can be formed on the wafer 20 using the processes described herein.

Figure 27:
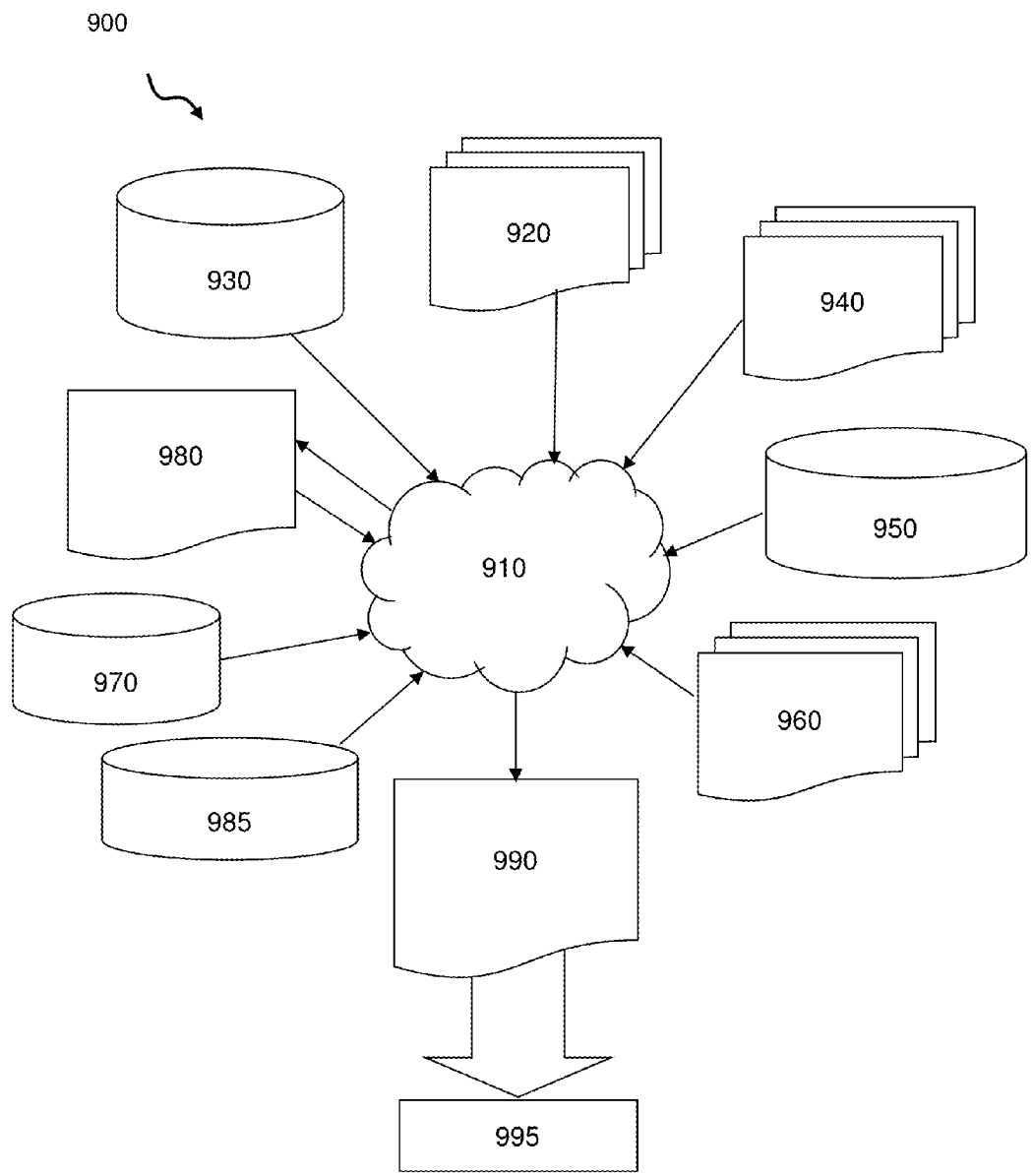
FIG. 27 is a flow diagram of a design process used in semiconductor design, manufacture, and/or test.

FIG. 27 is a flow diagram of a design process used in semiconductor design, manufacture, and/or test. FIG. 27 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-26. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 27 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-26. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-26 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-26. In one embodiment, design structure 990 may comprise a compiled, executable HDL simulation model that functionally simulates the devices shown in FIGS. 1-26.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-26. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims, if applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principals of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed:

1. A method, comprising:
   forming a plurality of isolation structures in pad films and an underlying substrate;
   forming a plurality of fins comprising the isolation structures and a second plurality of fins comprising two pad films and a portion of the underlying substrate, each of which are separated by a trench;
   removing portions of the second plurality of fins resulting in a height lower than a height of the plurality of fins comprising the isolation structures;
   forming gate electrodes within each trench, burying the second plurality of fins and abutting sides of the plurality of fins comprising the isolation structures; and
   etching a portion of one of the gate electrodes, at a location between two of the fins comprising the isolation structures and over the second plurality of fins, such that an upper surface of the one of the gate electrodes is lower than the two of the fins comprising the isolation structures and higher than the second plurality of fins,
   wherein the plurality of fins comprising the isolation structures electrically and physically isolate adjacent gate electrode of the gate electrodes.

2. The method of claim 1, wherein the underlying substrate is a BULK wafer.

3. The method of claim 1, wherein the underlying substrate is a Silicon on Insulator (SOI), and each trench is formed by etching to an insulator layer of the SOI.

4. The method of claim 1, wherein the pad films are deposited on the underlying substrate and trenches are formed in the pad films and portion of the underlying substrate, which are filled with insulator material to form the isolation structures.

5. The method of claim 4, wherein an upper pad film of the second plurality of fins is $Si_3N_4$.

6. The method of claim 5, wherein a lower pad film of the second plurality of fins is at least $SiO_2$.

7. The method of claim 1, wherein the removing portions of the second plurality of fins forms a stepped structure, with remaining portions of the second plurality of fins being lower than at least one of the plurality of isolation structures with respect to a surface of the underlying substrate.

8. The method of claim 1, wherein the plurality of fins comprising the isolation structures have a width of about 10 nm.

9. The method of claim 1, wherein the plurality of fins comprising the isolation structures have uniform spacing therebetween in a regular pattern.

10. The method of claim 1, wherein the adjacent gate electrodes are formed by deposition and etching processes.

11. The method of claim 10, wherein the etching of the adjacent gate electrodes is to a level lower than the plurality of fins comprising the isolation structures.

12. The method of claim 1, wherein the plurality of fins comprising the isolation structures have heights corresponding to adjacent gate electrodes, said heights of the isolation structures isolating the adjacent gate electrodes at a minimum image spacing.

13. The method of claim 1, wherein:
    the forming the plurality of fins comprising the isolation structures and a second plurality of fins comprises masking and etching to form the trenches, each the plurality of fins comprising the isolation structures and a second plurality of fins have two vertical sidewalls formed by the trenches; and
    the removing portions of the second plurality of fins includes selectively removing an upper one of the pad films,
    wherein the etching is selective to the upper one of the pad films.

14. A method comprising:
    forming a plurality of pad films each having different material compositions on a substrate;
    etching the pad films and a portion of the substrate to form a plurality of trenches;
    filling the trenches with insulator material to form a plurality of isolation structures;
    forming a second plurality of trenches which result in the formation of a plurality of fins comprising the isolation structures and a second plurality of composite fins comprising the plurality of pad films and the portion of the substrate;

removing an upper portion of the plurality of composite fins resulting in a height different than the plurality of fins comprising the isolation structures; and forming gate electrode stacks within each of the second plurality of trenches, burying the plurality of composite fins and abutting sides of the plurality of fins comprising the isolation structures, wherein the plurality of fins comprising the isolation structures electrically and physically isolate adjacent electrode stacks, wherein the gate electrode stacks are formed over and around the second plurality of fins comprising one of the two pad films and the portion of the underlying substrate, and an upper surface of the gate electrode stacks is lower than the two of the fins comprising the isolation structures and higher than the second plurality of fins.

15. The method of claim 14, wherein the underlying substrate is a BULK wafer.

16. The method of claim 14, wherein the underlying substrate is a Silicon on Insulator (SOI), and each trench forming the isolation structures and each trench of the second plurality of trenches is formed by etching to an insulator layer of the SOI.

17. The method of claim 14, wherein an upper pad film is $Si_3N_4$ and a lower pad film is $SiO_2$ for subsequent selective etching processes.

18. The method of claim 14, wherein the plurality of fins comprising the isolation structures have a width of about 10 nm.

19. The method of claim 14, wherein the adjacent electrode stacks are formed by deposition and etching processes.

20. The method of claim 14, wherein the plurality of fins comprising the isolation structures have heights corresponding to adjacent gate electrodes, said heights of the isolation structures isolating the adjacent gate electrodes at a minimum image spacing.

* * * * *